United States Patent
Davis-Marsh

(10) Patent No.: US 10,686,375 B1
(45) Date of Patent: Jun. 16, 2020

(54) POWER CONVERSION WITH MODULATED SWITCHING

(71) Applicant: TEXAS INSTRUMENTS INCORPORATED, Dallas, TX (US)

(72) Inventor: Marc Edric Davis-Marsh, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/264,327

(22) Filed: Jan. 31, 2019

(51) Int. Cl.
- H02M 3/156 (2006.01)
- H02M 1/00 (2006.01)
- H03K 5/24 (2006.01)
- G01R 19/02 (2006.01)

(52) U.S. Cl.
CPC ............ *H02M 3/156* (2013.01); *G01R 19/02* (2013.01); *H03K 5/24* (2013.01); *H02M 2001/0009* (2013.01); *H02M 2001/0025* (2013.01)

(58) Field of Classification Search
CPC ......... H02M 3/156; H02M 2001/0025; H02M 2001/0009; H02M 3/335; G05F 1/46
See application file for complete search history.

(56) References Cited

U.S. PATENT DOCUMENTS

| | | | | |
|---|---|---|---|---|
| 9,065,427 B2 * | 6/2015 | Kleinpenning | .... | H03K 5/00006 |
| 9,450,478 B1 * | 9/2016 | Djenguerian | ......... | H02M 1/088 |
| 10,088,854 B2 * | 10/2018 | Pham | ........................ | G05F 1/46 |
| 2010/0188129 A1 * | 7/2010 | Ma | .............................. | G06F 1/04 |
| | | | | 327/294 |
| 2011/0037505 A1 * | 2/2011 | Kawamoto | ............... | H03L 7/07 |
| | | | | 327/159 |
| 2011/0110126 A1 * | 5/2011 | Morrish | ................... | H02M 1/44 |
| | | | | 363/21.18 |
| 2012/0194162 A1 * | 8/2012 | Lin | ......................... | H02M 1/14 |
| | | | | 323/304 |
| 2013/0051089 A1 * | 2/2013 | Pan | ......................... | H02M 1/44 |
| | | | | 363/21.17 |
| 2014/0036552 A1 * | 2/2014 | Saji | ......................... | H02M 1/44 |
| | | | | 363/21.17 |
| 2015/0200593 A1 * | 7/2015 | Stoichita | ............... | H02M 3/158 |
| | | | | 323/271 |
| 2016/0134186 A1 * | 5/2016 | Saint-Pierre | ............ | H02M 1/44 |
| | | | | 363/19 |
| 2017/0070149 A1 * | 3/2017 | Guan | ......................... | G05F 1/46 |
| 2017/0104412 A1 * | 4/2017 | Tsai | ....................... | H02M 3/157 |
| 2019/0115986 A1 * | 4/2019 | Goller | .................... | H04B 15/04 |

* cited by examiner

*Primary Examiner* — Daniel Kessie
*Assistant Examiner* — Sisay G Tiku
(74) *Attorney, Agent, or Firm* — Michael A. Davis, Jr.; Charles A. Brill; Frank D. Cimino

(57) ABSTRACT

A power converter circuit includes a power stage circuit configured to convert an input voltage to provide an output voltage. A feedback control circuit is configured to generate an error signal based on the output voltage and a reference voltage. An offset circuit is configured to apply an offset signal to the error signal based on change in a modulating frequency of a clock signal to provide an adjusted error signal. A driver circuit is configured to drive the power stage circuit based on the adjusted error signal and the clock signal.

18 Claims, 5 Drawing Sheets

US 10,686,375 B1

POWER CONVERSION WITH MODULATED SWITCHING

TECHNICAL FIELD

This disclosure relates to integrated circuits and, more particularly, to a power conversion using modulated switching.

BACKGROUND

A switching regulator represents a primary category for power converters design. Switching regulators are usually efficient, low cost and dissipate little heat. Due to the internal switching action, they tend to generate noise, which may be an issue in some applications. To reduce such switching induced noise, some designs have adopted a modulated clock frequency, such as triangle or spread spectrum frequency modulation, to vary the switching frequency from cycle to cycle. However, such frequency modulation can lead to increased noise in the output for the modulating frequency.

SUMMARY

In one example, a power converter circuit includes a power stage circuit configured to convert an input voltage to provide an output voltage. A feedback control circuit is configured to generate an error signal based on the output voltage and a reference voltage. An offset circuit is configured to apply an offset signal to the error signal based on a modulating frequency of a clock signal to provide an adjusted error signal. A driver circuit is configured to drive the power stage circuit to provide the output voltage based on the adjusted error signal and the clock signal.

In another example, a converter circuit includes a power stage circuit coupled between an input and an output of the converter circuit, the power stage circuit including a control input. A driver circuit is coupled to the control input. A spread spectrum modulated clock generator is coupled to the driver circuit. A feedback control circuit has inputs coupled to the output of the converter circuit and a reference. An offset generator circuit has an input coupled to the clock generator and an output coupled to an output of the feedback control circuit.

In yet another example, a power conversion system includes a power stage connected between and input voltage and an output. The power stage is configured to provide an output voltage based on a driver control signal. An error amplifier is configured to compare the output voltage with respect to a reference voltage and provide an error signal. A clock generator is configured to generate a frequency-modulated clock signal. An offset generator is configured to generate an offset based on the frequency-modulated clock signal, the offset being added to the error signal to provide a command signal. A driver is configured to generate the driver control signal based on the command signal and according to the frequency-modulated clock signal.

DETAILED DESCRIPTION

Figure 1:
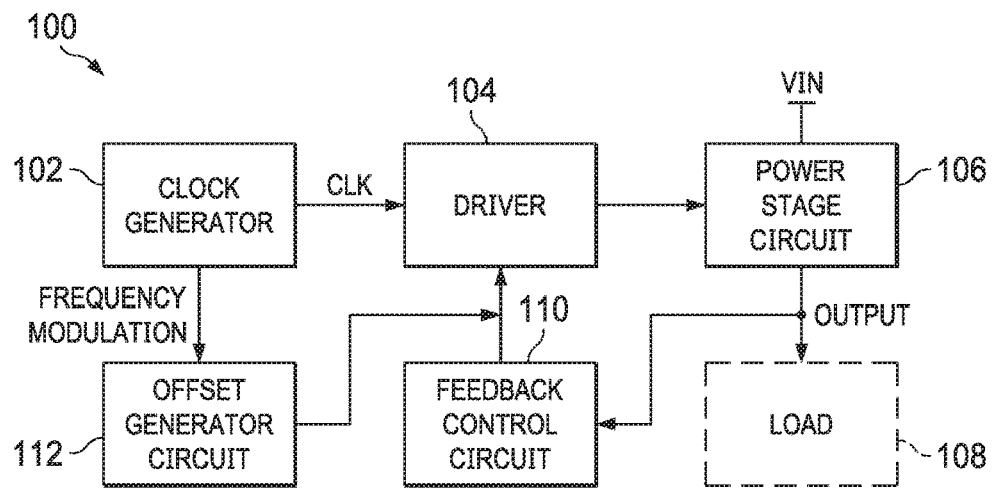
FIG. 1 illustrates an example block diagram of a power converter circuit with modulation offset compensation.

This disclosure relates to power conversion with frequency modulation offset compensation. For example, a power converter utilizes a spread spectrum or other frequency-modulated clock to operate switch devices of the power converter. The power converter includes a feedback loop with an error amplifier to generate an error amplifier output based on comparing the output voltage with a reference. The systems and method herein add an offset to the error amplifier output to compensate for frequency changes caused by the modulated clock. For example, the offset can be proportional to the amount of frequency change caused by the frequency-modulated clock. Alternatively or additionally, the offset can be further compensated to accommodate for changes in input voltage, output voltage and/or component tolerances.

In an example converter implementing a current mode control scheme, if the frequency of the clock is being lowered versus the previous switching cycle, the device will reach the same peak current commanded by the error amplifier but because of the extended clock period the valley current will be lower than for the previous cycle. This has the net effect of a lower RMS inductor current, to which the error amplifier would need to adjust in the absence of the solution herein. As disclosed herein, an offset can be added to the error amplifier output to increase the peak current command by half of the valley current decrease, such that the root-mean-square (RMS) output current remains constant. In a voltage mode control scheme, a similar offset can be supplied to adjust voltage command to maintain the RMS output voltage substantially constant. As a result, there will be less noise at the modulating frequencies than in many existing spread spectrum power converters. Thus, in contrast to approaches that just spread the noise over a wider frequency, the offset compensation disclosed herein enables reducing the power of the noise in the output during steady state operation of the power converter. Additionally, the approach disclosed herein is applicable to reduce noise for any type of clocking modulation that may be used. Examples of modulation techniques, which can be used for generating the converter clock signal, include triangular and pseudo random spread spectrum modulation (e.g., advanced random spread spectrum (ARSS), frequency-hopping spread spectrum (FHSS), direct-sequence spread spectrum (DSSS), time-hopping spread spectrum (THSS), chirp spread spectrum (CSS), or combinations thereof).

As used herein, the term circuit can include a collection of active and/or passive elements that perform a circuit function such as an analog circuit or control circuit. Additionally, or alternatively, the term circuit can include an integrated circuit (IC) where all or some of the circuit elements are fabricated on a common substrate, such as a semiconductor device (e.g., IC chip or die). In the following examples, the power converter circuit may implement current mode control or voltage control scheme.

FIG. 1 illustrates an example block diagram of a power converter circuit 100 configured to implement modulation offset compensation. The power converter circuit 100 includes a clock generator 102 that is configured to supply a clock signal (CLK) to an input of a driver 104. The clock signal CLK can be a wideband frequency-modulated signal that is used to set the switching frequency for the driver 104. For example, the clock generator 102 can provide the clock signal CLK by modulating a reference clock with a random or pseudo random number to provide the clock signal with a spread spectrum modulating switching frequency (e.g., modulated using triangular or pseudo random spread spectrum modulation). The spread spectrum switching frequency is used to reduce electromagnetic interference (EMI) in certain frequency bands, such as to comply with government regulations and/or other technical standards.

The driver 104 is configured to provide driver signals to control power stage circuit 106 based on the frequency-modulated clock signal CLK. The power stage circuit 106 includes one or more switch devices (e.g., power field effect transistors (FETs) or bipolar junction transistors (BJTs)) connected between an input voltage (VIN) and an OUTPUT. The power stage circuit 106 is configured to convert the input voltage VIN to provide an output voltage (VOUT) and current to a load 108 in response to the driver signals. The conversion can implement a buck, boost, buck-boost operation or other power topologies (e.g., isolated topologies, such as flyback) to modify the input voltage VIN.

Feedback control circuit 110 monitors the OUTPUT that is generated by the power stage circuit 106. For example, the OUTPUT can be sensed (e.g., by a sense resistor) to provide a feedback signal representing an output voltage at the OUTPUT. The feedback control circuit (e.g., includes an error amplifier) 110 is configured to provide an error signal to the driver 104 based on a comparison of the OUTPUT with respect to a reference. The feedback control circuit 110 thus provides the error signal to implement closed loop control for setting the OUTPUT.

The power converter circuit 100 also includes offset generator circuit 112 configured to apply an offset signal to the error signal based on the spread frequency modulation of the clock signal, which results in an adjusted error signal being supplied to the driver 104. For example, the offset generator circuit generates the offset signal to be proportional to a change in a spread spectrum modulating frequency of the clock signal CLK. The driver 104 thus drives the power stage circuit 106 based on the adjusted error signal and the clock signal.

By way of example, the offset generator circuit 112 is configured to provide the offset to modulate the output of the feedback control circuit 110 based on the spread spectrum modulation pattern with an appropriate gain setting to decrease variation in the RMS of the OUTPUT (e.g., current or voltage). In examples where the power converter circuit 100 implements current mode control, the offset generator circuit 112 thus can be configured provide the offset to be proportional to a change in the RMS of the output current provided by the power stage circuit 106, which changes according to the spread spectrum modulating pattern of the clock signal CLK. The offset signal thus is introduced into the control loop to compensate for the frequency change effects that result from using spread spectrum modulating pattern. While the offset generator circuit 112 is demonstrated as separate from the feedback control circuit 110, in other examples, the offset generator circuit may be part of the feedback control circuit.

In some examples, the clock generator 102 is configured to modulate a reference clock (e.g., provided by an oscillator circuit) based on an input bit pattern to provide the clock signal CLK. In this example, the offset generator circuit 112 is configured to generate the offset signal based on the input bit pattern. The input bit pattern may be a random or pseudorandom bit pattern, such as generated by a pseudo random number generator. In another example, the offset generator circuit 112 is configured to generate the offset signal based on the clock signal CLK or based on the clock reference signal from which the clock signal CLK is generated.

Figure 2:
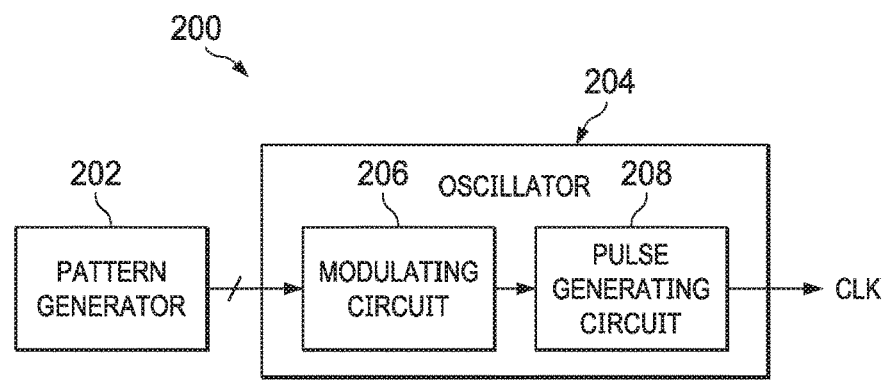
FIG. 2 illustrates an example block diagram of a spread spectrum clock generator.

FIG. 2 illustrates an example block diagram of spread spectrum clock generator 200 configured to generate a clock signal CLK (e.g., corresponding to the clock generator 102 of FIG. 1). The clock generator includes a pattern generator 202 that supplies an N bit pattern to an input of an oscillator 204, where N is a positive integer denoting the number of bits in the pattern). For example, the bit pattern is a pseudo random spread spectrum bit pattern. The oscillator 204 is configured to provide the clock signal CLK based on the input bit pattern. The oscillator 204 includes a modulating circuit 206 and a pulse generating circuit 208. The modulating circuit 206 provides a modulation signal based on the input bit pattern. For example, the modulating circuit 206 is configured to modulate a clock reference in response to the input bit pattern and a ramp. The pulse generating circuit (e.g., a flip-flop) 208 is configured to generate the clock signal CLK based on the modulated clock reference that is compared with respect to a ramp signal.

Figure 3:
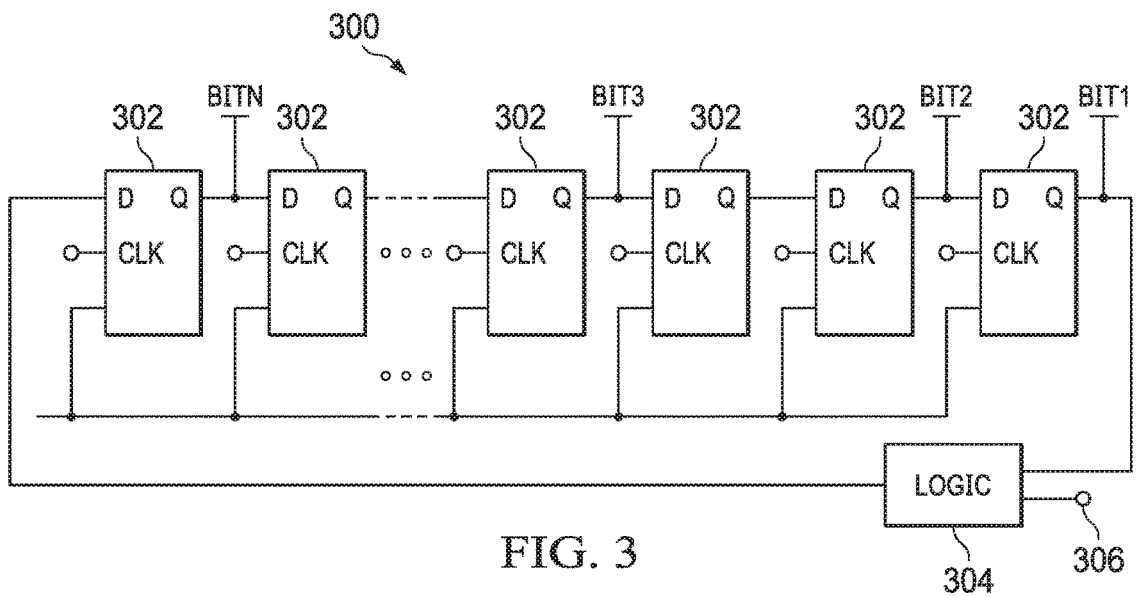
FIG. 3 illustrates an example circuit diagram of a pattern generator that can be used to modulate a clock signal.

By way of further example, FIG. 3 illustrates an example circuit diagram of a pattern generator (e.g., corresponding to pattern generator 202 of FIG. 2) 300 configured to generate a bit pattern for modulating a clock signal. In this example, the pattern generator 300 includes a plurality of D-type flip-flops 302 connected in series. The outputs of a set of the flip-flops 302 are tapped to provide an N-bit pattern. While four bits of the pattern generator are tapped in this example, any number N, which may be less than or greater than four, could be used in other examples. Logic 304 is connected to one of the outputs and at least one other input 306 (e.g., an output of another flip-flop 302) to provide a corresponding logic output to a given one of the flip-flops 302, such as to the first flip-flop in the arrangement of flip-flops. The logic 304 can include one or more logic gates configured to perform a corresponding logic operation (e.g., AND, NAND, OR, NOR, XOR, XNOR or a combination of these or other logic functions) with respect to its inputs, which adds further variation to the input of the flip-flop that receives the logic output. In one example, the logic 304 is an exclusive-OR (XOR) gate that receives as inputs BIT1 and the other input 306 coupled to receive a Q output of another one of the flip-flops 302. The N-bit output pattern can be a pseudo random pattern that is buffered or provided directly to modulate the clock reference signal.

Figure 4:
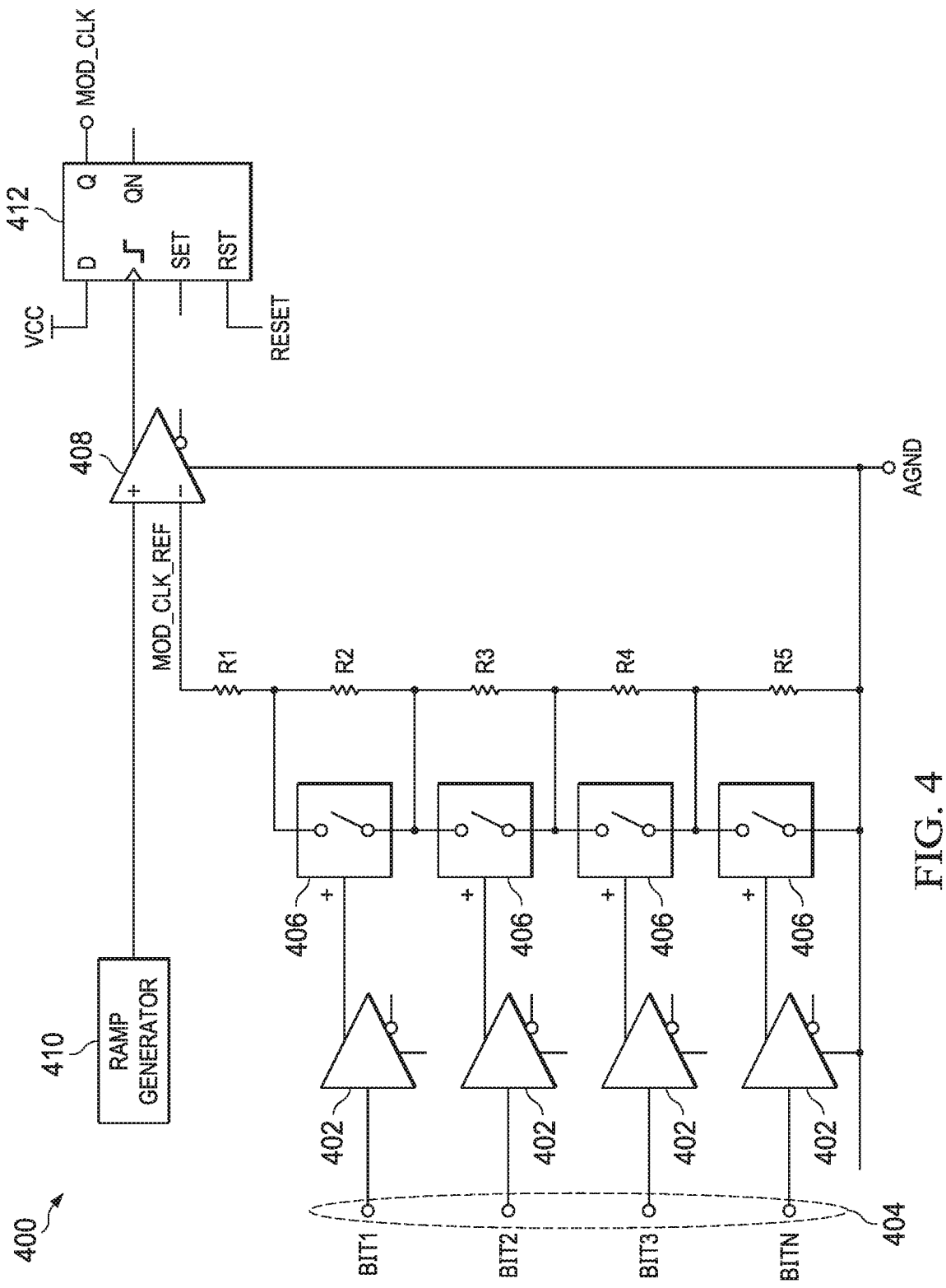
FIG. 4 illustrates an example of a clock generator circuit configured to generate a frequency-modulated clock signal.

FIG. 4 illustrates an example of a clock generator circuit 400 configured to generate a frequency-modulated clock signal, such as a spread spectrum modulated clock signal. For example, the clock generator circuit 400 corresponds to the clock generator 102 of FIG. 1 or clock generator 200 of FIG. 2. The clock generator 400 includes amplifiers 402 having inputs 404 coupled to receive an N-bit input bit pattern, demonstrated as bits BIT1, BIT2, BIT3 and BITN. For example, the N-bit input bit pattern is provided by a pattern generator (e.g., pattern generator 202, 300). Each of the amplifiers has an output that is coupled to control a respective switch device 406. A set of resistors R1, R2, R3, R4, RN+1 are connected in series to provide a resistive path between an inverting input of a comparator 408 and electrical ground. The resistors may each have the same or different resistance values. Each of the switch devices 406 are connected in parallel with an associated resistor R2, R3, R4, RN+1. For example, activation of a given switch device 406 to a closed condition, in response to its input bit being asserted, bypasses (e.g., shunts) its associated resistor through the given switch. In contrast, deactivation of a given switch device 406 to an opened condition, in response to its input bit being de-asserted, places (or keeps, if already there) its associated resistor in the resistive path through the given switch. The modulated clock reference signal (MOD_CLK_REF) is also coupled to the inverting input of the comparator 408. In an example, the modulated clock reference signal is varied in amplitude with respect to time based on the input bit pattern. Thus, the modulated clock reference signal MOD_CLK_REF dynamically changes according to which resistors R2, R3, R4, RN+1 are connected in the path between the non-inverting input and electrical ground. The resulting changes in resistance based on the input bit pattern modulate the clock reference signal accordingly.

A ramp generator circuit 410 is configured to provide a ramp signal to an inverting input of the comparator 408. For example, the ramp signal may be an analog or digital ramp signal, such as a saw-tooth, triangular or sinusoidal waveform having a known frequency (e.g., a reference clock frequency). The comparator 408 is configured to compare the ramp signal with the modulated clock reference signal MOD_CLK_REF and provide a comparator output based on such comparison. For example, the comparator output can be asserted (high) when the ramp signal exceeds the modulated clock reference MOD_CLK_REF and de-asserted (low) when the ramp is less than the modulated clock reference. The comparator output is connected to a clock input of a flip-flop (e.g., a D flip-flop) 412 and a fixed DC voltage (e.g., VCC) is connected to the input of the flip-flop. The flip-flop 412 is configured to generate modulated clock output pulses having a frequency that varies over time based on the comparator output. Because the clock reference is modulated by the input bit pattern, the flip-flop 412 provides the output pulses with a modulated frequency that likewise varies according to the input bit pattern. The flip-flop 412 may include a reset input that can be asserted to reset the output to a starting value.

Figure 5:
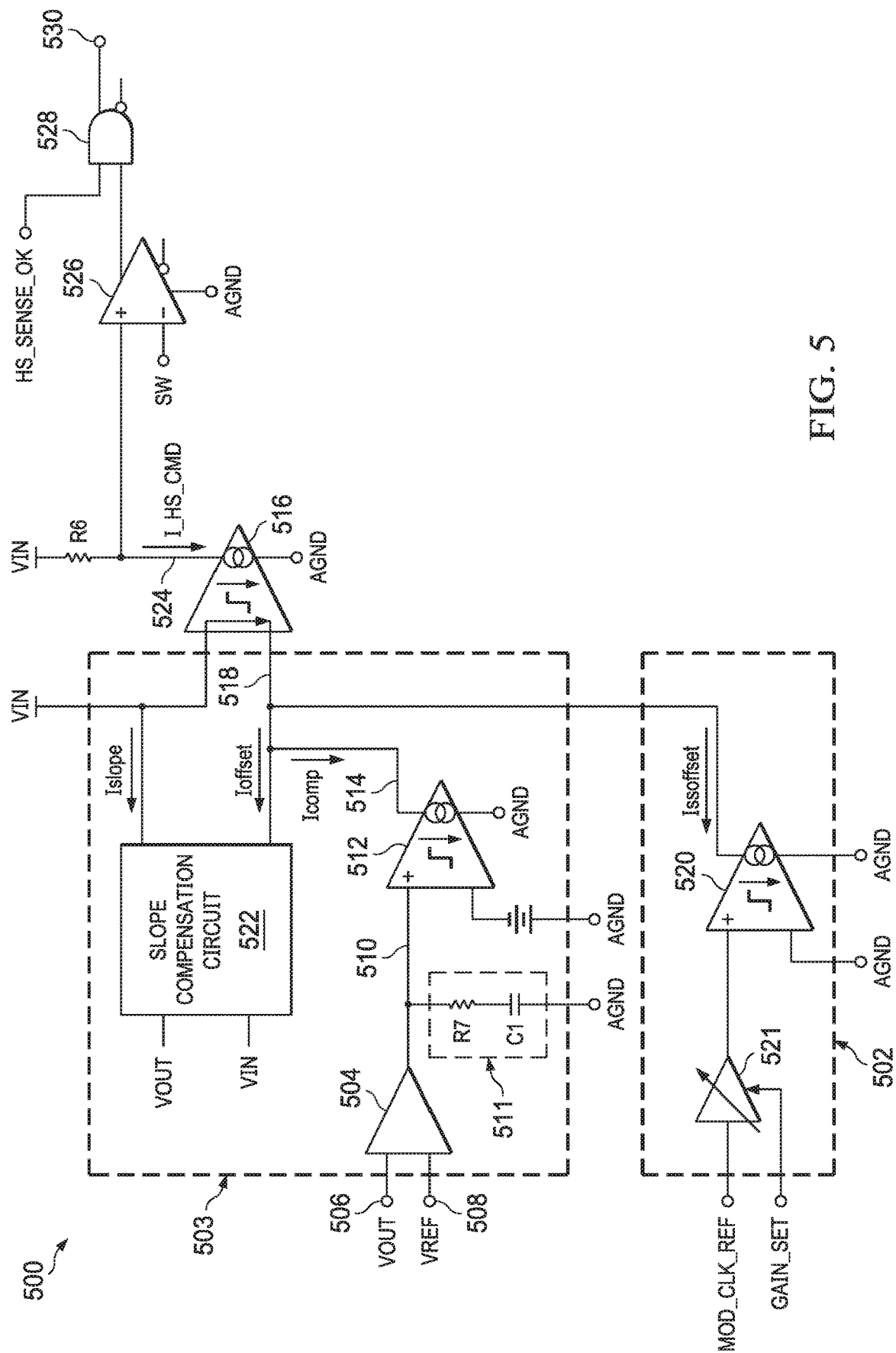
FIG. 5 illustrates an example circuit diagram of part of a power converter that includes frequency modulation offset circuit.

FIG. 5 illustrates an example circuit diagram of part of a power converter circuit 500 that includes frequency modulation offset circuit 502 and a feedback control circuit 503, such as disclosed herein. For example, the frequency modulation offset circuit 502 corresponds to the offset generator circuit 112 of FIG. 1 and the feedback control circuit 503 corresponds to circuit 110 of FIG. 1. The part of the power converter circuit 500 shown in FIG. 5 corresponds to high-side control circuit, such as to control a high-side switch device (not shown) of the power converter. In this example, the power converter circuit 500 is configured to implement a current mode control scheme; however, the frequency modulation offset approach disclosed herein is applicable to voltage mode control or other control schemes. An output 530 of the circuit 500 may be coupled to a driver (e.g., driver 104) to control a high-side switch device (e.g., power FET of the power stage circuit 106).

By way of example, the high-side control circuit of the power converter circuit 500 includes an error amplifier 504 having inputs 506 and 508 to receive a feedback voltage (e.g., corresponding to the power converter output voltage VOUT) and a reference voltage VREF. The error amplifier 504 is configured to compare VOUT and VREF to produce a comparator voltage (VCOMP) at 510, which is an error signal based on the comparison. For example, the feedback voltage corresponds to the output voltage VOUT, and is regulated to the reference voltage VREF by the power converter circuit 500. In some examples, a loop compensation block 511 may be coupled between the output 510 and electrical ground. As one example, the loop compensation 511 includes a resistor R7 and capacitor C1 coupled in series between 510 and ground. In this current mode example, a voltage-to-current converter amplifier 512 is configured to convert the error amplifier output voltage VCOMP to a corresponding error current (Icomp) that is provided at output 514. The output 514 is coupled to an input 518 of a current amplifier 516 (e.g., a unity gain current mirror).

The output of the frequency modulation offset circuit 502 is also connected to the input of the current amplifier 516. The frequency modulation offset circuit 502 is configured to produce an error amplifier offset current (Issoffset) to compensate for the effects of frequency changes from using a frequency-modulated clock signal (e.g., MOD_CLK_REF). The current amplifier 516 thus is configured to combine the error current Icomp and the offset current Issoffset for generating a high-side command current (I_HS_CMD) signal for controlling a high-side power switch device (e.g., of power stage circuit 106).

As an example, a spread spectrum modulated clock signal MOD_CLK_REF (e.g., from clock generator circuit 400 of FIG. 4) is applied to a voltage-to-current converting amplifier 520 to provide the offset current Issoffset to the input of the amplifier 516. The offset current Issoffset is thus summed with the error current Icomp at the input of the amplifier 516. For example, the offset current Icomp is dynamically adjusted based on the frequency-modulated clock signal MOD_CLK_REF to either add current or subtract current to the high-side command and thereby compensate for RMS error in the power converter output due to frequency changes in the MOD_CLK_REF. While the frequency-modulated clock reference MOD_CLK_REF is demonstrated as being input to the offset circuit 502, in other examples, the bit pattern (e.g., corresponding to bits 404) can be provided to generate the offset current Issoffset. In an example, the offset current Issoffset may be provided at a level that is proportional to one-half a change in the RMS current through the inductor in the output current path. Because the frequency modulation offset circuit 502 provides its offset to vary based on the frequency modulation, it can respond more quickly to frequency changes than the error amplifier. In this way, the RMS output current can be maintained at a substantially constant level with reduced noise while enabling the reduced EMI to be achieved through the use of spread spectrum or other frequency modulation.

In some examples, the circuit 500 can include circuitry configured to adjust the offset current Issoffset to compensate for changes in the input voltage, output voltage and/or component tolerances. As an example, a variable gain amplifier 521 is connected between the input, which receives the frequency-modulated clock reference MOD_CLK_REF (e.g., as provided to inverting input of comparator 408 of FIG. 4), and the amplifier 520. The variable gain amplifier 521 can include one or more control inputs (GAIN_SET) that are set based on the input voltage VIN, output voltage VOUT and/or other operating parameters (e.g., component tolerances). The variable gain amplifier 521 thus is configured to compensate the offset current Issoffset based on the GAIN_SET (e.g., based on VIN, VOUT or other parameters). Other circuitry may be used to compensate the offset current Issoffset in other examples.

In some examples, such as where the power converter circuit 500 implements current mode control, the power converter circuit 500 may also include a slope compensation circuit 522. The slope compensation circuit 522 is configured to introduce current to stabilize the control loop. For example, the slope compensation circuit 522 may implement slope compensation that is either fixed or it can be generated based on the input voltage (VIN) and/or the output voltage (VOUT) of the power converter. As a further example, the slope compensation circuit can provide a slope offset current (Ioffset) to the same input of the amplifier 516 to which the Icomp and Issoffset current signals are provided. Additionally, in some examples, the slope compensation circuit can provide a slope current (Islope) to another input of the comparator that is coupled to VIN (or other voltage). Slope compensation thus can reduce noise caused by sub-harmonic oscillation in the power converter circuit 500, such as when inductor ripple current does not return to its initial value by the start of a next switching cycle. In this example, the current signal provided at the input 518 of the current amplifier 516 is a summation of the error amplifier output Icomp, the slope offset compensation signal Ioffset and the frequency modulation offset signal Issoffset. In an example, the slope compensation circuit is configured to provide slope offset compensation and slope signals as voltages. In this example, the slope compensation circuit can include respective voltage-to-current converters (e.g., transconductance amplifiers) to convert such voltages to the respective slope offset compensation signal Ioffset and slope current signal Islope.

The current amplifier 516 has an output 524 coupled to the input voltage VIN through a sense resistor R6. The current amplifier 516 is configured to generate a high-side command current (I_HS_CMD) based on the summed currents supplied to the current amplifier 516. For example, the current amplifier 516 is configured as a unity gain amplifier such that the high-side command current I_HS_CMD is proportional to the sum of the input currents (e.g., I_HS_CMD=Icomp+Issoffset+Ioffset). The high-side command current I_HS_CMD results in a voltage drop across the resistor to provide a corresponding command voltage (V_HS_CMD) to an input of a high-side comparator 526. A switch signal SW is provided to the other input of the comparator 526. For example, the switch signal SW corresponds to the signal at a node between the high-side and low-side switches of the power switching stage. The comparator thus provides a comparator output based on a comparison of the command voltage V_HS_CMD and the switch node signal SW.

The comparator output is provided to control the high-side switch. For example, the comparator output is coupled to an input of an AND gate 528, and a high-side sense signal (HS_SENSE_OK) is provided to the other input of the AND gate. The driver can provide the high-side sense signal HS_SENSE_OK as control to enable or disable the high-side control and prevent false triggering of the comparator logic due to noise in the switch node signal SW. For example, when the high-side sense signal HS_SENSE_OK and the comparator output are both asserted high, the AND gate provides a high output at 530 to the driver (e.g., driver 104) to turn off the high-side switch device (e.g., of power stage circuit 106), which terminates peak current from being provided to the power converter output.

In the example of FIG. 5, the frequency modulation offset circuit 502 thus provides the error amplifier offset current Issoffset to dynamically adjust the high-side command current I_HS_CMD to compensate for RMS errors due to spread spectrum modulated clock signal. In this way, current is added to or subtracted from the current command according to frequency changes in the frequency-modulated clock signal. By way of example, if the frequency of the clock signal is lower, the frequency modulation offset circuit 502 provides Issoffset to add current to Icomp so that the high-side comparator delays turning off the high-side switch device. The subsequent delayed turn-on of low-side switch device is balanced by the increased period resulting in increased peak to peak inductor current ripple, but decreased change to RMS current.

In some examples, the power converter circuit 500 can be implemented as an IC semiconductor chip device that interfaces with external components (e.g., including the input supply VIN, inductor circuit and load). In some examples, the power converter circuit 500 may be implemented with a subset of the components described herein or additional components may be added.

Figure 6:
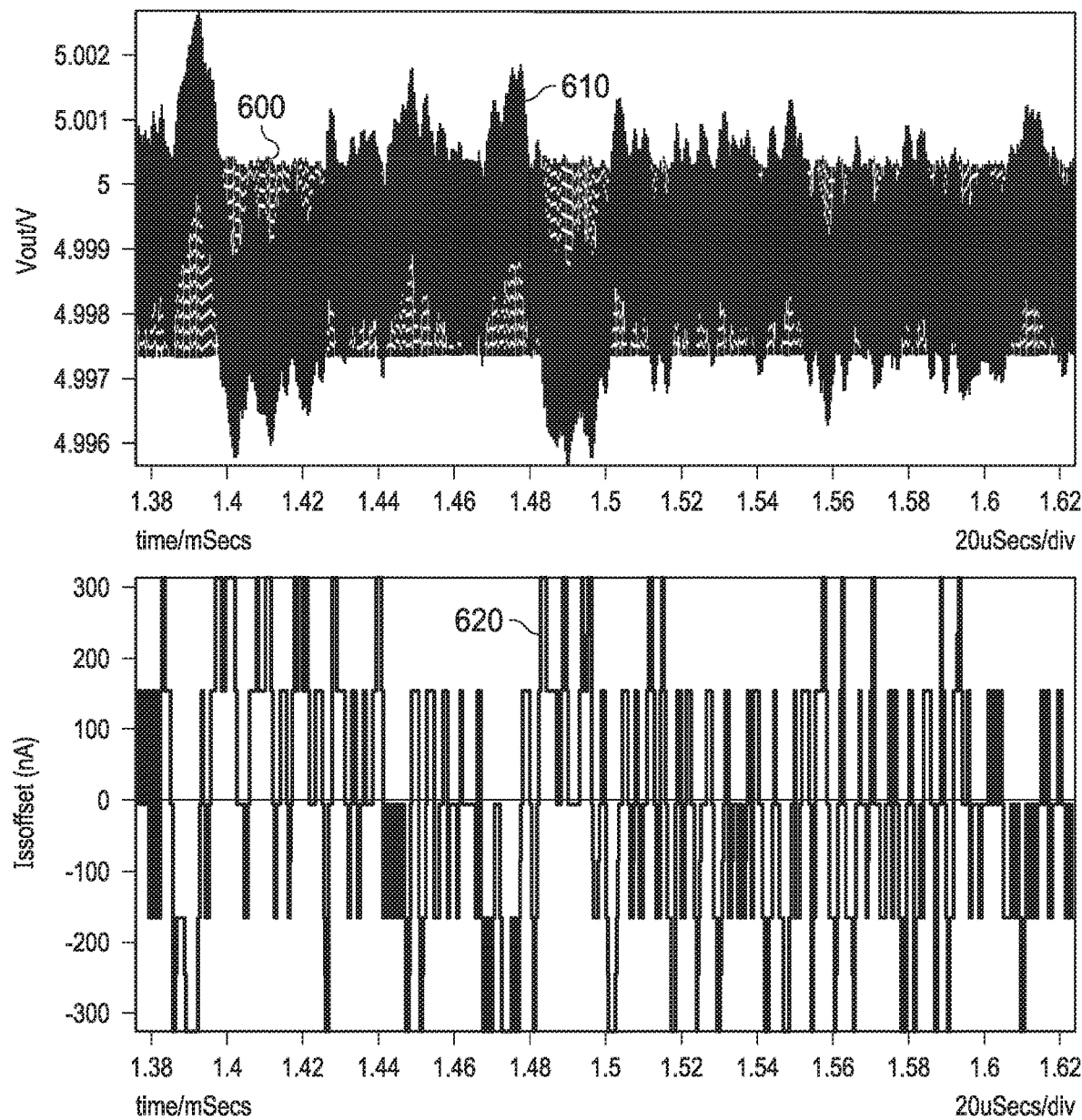
FIG. 6 is a plot of output voltage over time demonstrating reduced noise when offset correction is implemented compared to without implementing modulation offset compensation.

FIG. 6 depicts plots 600 and 610 of output voltage over time. The plot 600 demonstrates reduced noise when frequency modulation offset correction is implemented, as disclosed herein, compared to the plot 610 without implementing modulation offset compensation. FIG. 6 also includes a plot 620 of the error amplifier offset current Issoffset that is generated over the same time period based on spread spectrum frequency modulation of the clock signal to compensate for noise resulting from the effects of frequency changes. As shown, the application of the error amplifier offset current Issoffset results in a substantially constant output voltage over time, shown at 600. That is, the output voltage of plot 600 has significantly less noise than the typical noise induced by the spread spectrum modulation shown in plot 610.

Figure 7:
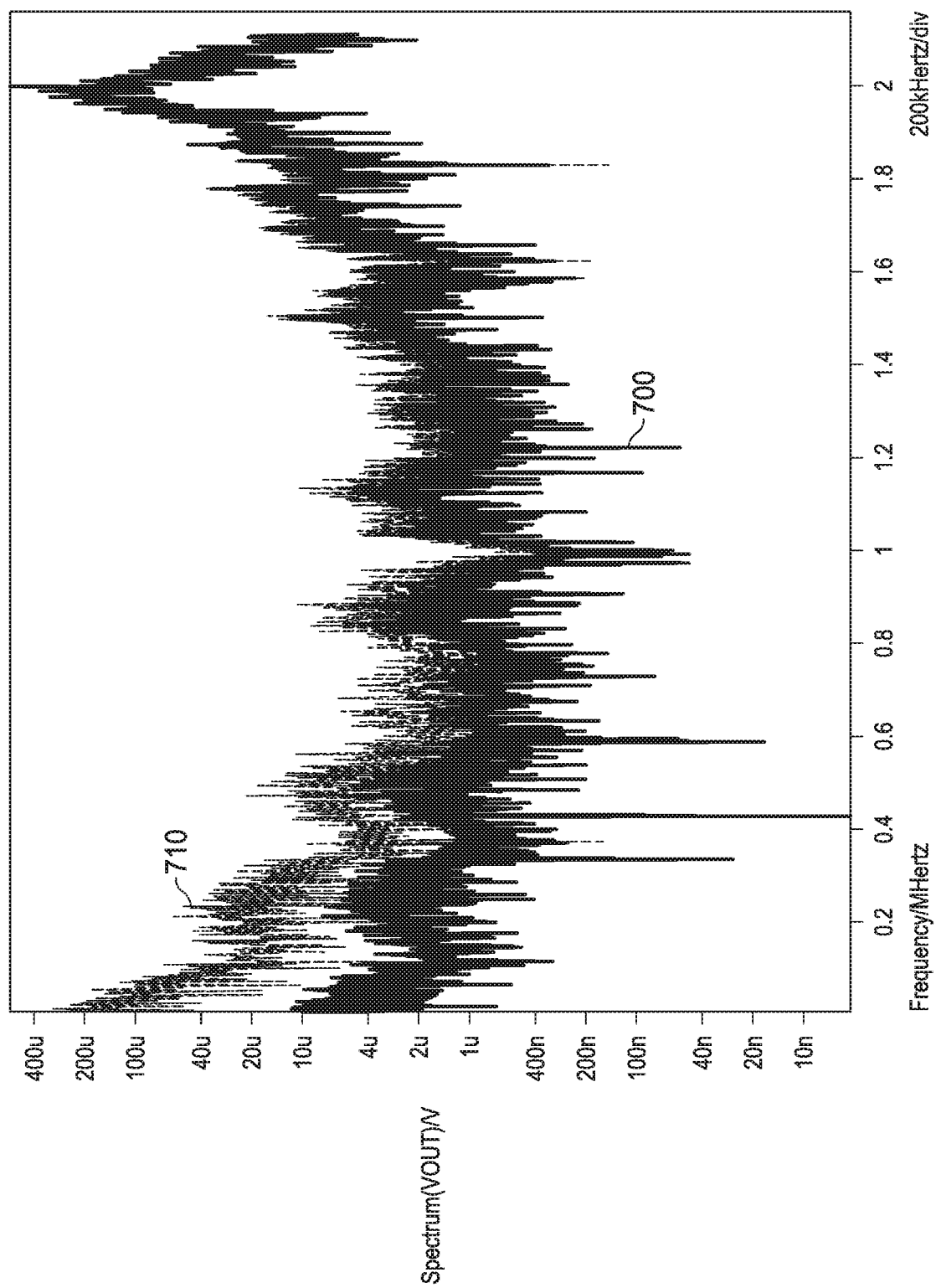
FIG. 7 is a plot of frequency spectrum for the output voltage generated using spread spectrum modulation with and without modulation offset compensation.

FIG. 7 illustrates plots 700 and 710 of frequency spectrum for the output voltage generated using spread spectrum modulation both with and without modulation offset compensation. For example, the frequency spectra of plots 700 and 710 can be provided by performing a fast Fourier transform operation on the output voltage. The plot 700 corresponds to the spectrum of the output when modulation offset compensation is implemented, such as disclosed herein. The plot 710 corresponds the spectrum when no modulation offset compensation is implemented. As shown, the power spectral density at the modulating frequencies is greatly reduced in the plot 700 compared to plot 710. The peak-to-peak inductor variation is also decreased in plot 700 relative to plot 710.

In view of the foregoing structural and functional features, the example embodiments disclosed herein compensate for the effect of the frequency changes on converter steady state functionality in order to lower the power of the noise. This is in contrast to existing approaches that operate to spread the modulating energy over a wider frequency band. The approach disclosed herein further may be implemented to lower the noise for any type of frequency modulation scheme. As disclosed herein, the approach is applicable to improve performance of power converters, using either a voltage or current mode control scheme.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A power converter circuit comprising:
a power stage circuit configured to convert an input voltage to provide an output voltage;
a feedback control circuit configured to generate an error signal based on the output voltage and a reference voltage;
an offset circuit configured to apply an offset signal including an offset current to the error signal based on a change in a modulating frequency of a clock signal to provide an adjusted error signal;
a driver circuit configured to drive the power stage circuit based on the adjusted error signal and the clock signal; and
a clock generator configured to provide the clock signal, wherein the clock generator is configured to modulate a reference clock signal based on an input bit pattern to provide the clock signal having a spread spectrum modulating frequency,
wherein the offset circuit is configured to generate the offset signal based on the input bit pattern.

2. The circuit of claim 1, wherein the clock generator further comprises a pattern generator configured to provide the input bit pattern as a pseudorandom bit pattern.

3. The circuit of claim 1, further comprising a clock generator configured to provide the clock signal, wherein the clock generator comprises an oscillator circuit to provide a reference clock signal that is frequency-modulated to provide the clock signal.

4. The circuit of claim 1, wherein the offset signal is proportional to the change in the modulating frequency of the clock signal.

5. The circuit of claim 1, wherein the error signal is a current signal, the feedback control circuit is configured to apply the offset signal to adjust the current signal based on the change in the modulating frequency of the clock signal.

6. The circuit of claim 5, wherein the offset signal is proportional to a change in a root-mean-square of an output current that varies based on the change in the modulating frequency of the clock signal.

7. The circuit of claim 1, further comprising a slope compensation circuit configured to generate a slope compensation signal, the slope compensation signal being combined with the error signal and the offset signal to generate a command signal to drive the power stage circuit.

8. The circuit of claim 1, wherein the offset circuit is configured to generate the offset signal in response to the clock signal having the modulating frequency.

9. The circuit of claim 1, wherein at least the feedback control circuit, the offset circuit, the power stage circuit, and the driver circuit are on a common substrate of an integrated circuit chip.

10. The circuit of claim 1, further comprising a circuit configured to adjust the offset to compensate for changes in at least one of the input voltage and output voltage.

11. A converter circuit, comprising:
a power stage circuit coupled between an input and an output of the converter circuit, the power stage circuit including a control input;
a driver circuit coupled to the control input;
a spread spectrum modulated clock generator coupled to the driver circuit;
a feedback control circuit having inputs coupled to the output of the converter circuit and a reference; and
an offset generator circuit having an input coupled to the clock generator and an output coupled to an output of the feedback control circuit, the offset generator circuit having a first voltage-to-current converter configured to convert a spread spectrum modulating frequency, of a clock signal produced by the clock generator, to a current offset signal, the current offset signal applied to the error signal for generating an adjusted error signal.

12. The converter circuit of claim 11, wherein the feedback control circuit comprises an error amplifier having inputs coupled to the output of the converter circuit and a reference signal, the error amplifier configured to provide an error signal based on an output voltage at the output of the converter circuit and the reference signal.

13. The converter circuit of claim 11, further comprising a circuit configured to compensate the offset signal to accommodate for changes in at least one of the input voltage and output voltage.

14. The converter circuit of claim 11, wherein the driver circuit is configured to drive the power stage circuit to provide the output voltage based on the adjusted error signal.

15. The converter circuit of claim 11, further comprising a second voltage-to-current converter coupled to the output of the error amplifier, the other voltage-to-current configured to convert the error signal to a corresponding current signal, the current offset signal being added to the corresponding current signal to provide a command current for driving the power stage circuit.

16. The converter circuit of claim 11, wherein the clock generator further comprises:
a pattern generator configured to provide an input bit pattern; and
an oscillator circuit configured to modulate a reference clock signal based on the input bit pattern and provide the clock signal having the spread spectrum modulating frequency.

17. The converter circuit of claim 11, further comprising a slope compensation circuit configured to generate a slope compensation signal, the slope compensation signal being combined with an error signal from the feedback control circuit and an offset signal from the offset generator circuit to provide a command signal to drive the power stage circuit.

18. A power conversion system comprising:
a power stage connected between and input voltage and an output, the power stage configured to provide an output voltage based on a driver control signal;
an error amplifier configured to compare the output voltage with respect to a reference voltage and provide an error signal;
a clock generator configured to generate a frequency-modulated clock signal;
an offset generator configured to generate an offset current based on a change in the frequency-modulated clock signal, the offset current being added to the error signal to provide a command signal;
a driver configured to generate the driver control signal based on the command signal and according to the frequency-modulated clock signal; and a pattern generator to generate a pseudo random bit pattern,
wherein the clock generator includes an oscillator configured to modulate a reference clock in response to the bit pattern to provide the frequency-modulated clock signal, and
wherein the offset generator is configured to generate the offset in response to the bit pattern or the frequency-modulated clock signal.

* * * * *